United States Patent
Lee et al.

(10) Patent No.: US 12,205,973 B2
(45) Date of Patent: *Jan. 21, 2025

(54) IMAGE SENSOR COMPRISING STACKED PHOTO-SENSITIVE DEVICES

(71) Applicant: IMEC VZW, Leuven (BE)

(72) Inventors: Jiwon Lee, Herent (BE); Kris Myny, Heusden-Zolder (BE); Florian De Roose, Rumst (BE); Pierre Boulenc, Woluwe Saint Lambert (BE)

(73) Assignee: IMEC VZW, Leuven (BE)

( * ) Notice: Subject to any disclaimer, the term of this patent is extended or adjusted under 35 U.S.C. 154(b) by 416 days.

This patent is subject to a terminal disclaimer.

(21) Appl. No.: 17/572,817

(22) Filed: Jan. 11, 2022

(65) Prior Publication Data
US 2022/0223643 A1 Jul. 14, 2022

(30) Foreign Application Priority Data

Jan. 14, 2021 (EP) ..................................... 21151621

(51) Int. Cl.
*H01L 27/146* (2006.01)

(52) U.S. Cl.
CPC .... *H01L 27/14652* (2013.01); *H01L 27/1461* (2013.01); *H01L 27/14636* (2013.01); *H01L 27/14638* (2013.01); *H01L 27/14689* (2013.01)

(58) Field of Classification Search
CPC ........... H01L 27/14652; H01L 27/1461; H01L 27/14636; H01L 27/14638;
(Continued)

(56) References Cited

U.S. PATENT DOCUMENTS

| 5,965,875 A | 10/1999 | Merrill |
| 9,748,295 B2 | 8/2017 | Lee et al. |

(Continued)

FOREIGN PATENT DOCUMENTS

| JP | 2011129785 A | 6/2011 |
| JP | 2017157801 A | 9/2017 |

OTHER PUBLICATIONS

European Search Report for Application No. 22151202.3-1211, dated Jun. 1, 2022, 5 pages.
(Continued)

*Primary Examiner* — Joseph C. Nicely
*Assistant Examiner* — Alvin L Lee
(74) *Attorney, Agent, or Firm* — MOSER TABOADA

(57) ABSTRACT

An image sensor comprises at least two vertically stacked photo-sensitive devices wherein each respective photo-sensitive device comprises a stack of a top electrode, a first charge transport layer and an active layer. Each respective stack generates electrical charges in response to a corresponding predefined range of wavelengths of light incident on the image sensor.

Each photo-sensitive device further comprises a second charge transport layer having a first portion, vertically aligned underneath the active layer, and a second portion, transfer region, protruding laterally to extend beyond the active layer. A dielectric layer separates the first portion from a bottom electrode providing a voltage for depleting the first portion, and the transfer region from a transfer gate providing a voltage for transferring the generated electrical charge to a floating electrical connection, shared by all stacked photo-sensitive devices.

The floating electrical connection couples to a read-out-circuitry.

6 Claims, 5 Drawing Sheets

(58) Field of Classification Search
CPC ......... H01L 27/14689; H01L 27/14641; H01L 27/14667; H01L 27/14612; H10K 39/32; H10K 30/10; G03G 5/04
See application file for complete search history.

(56) References Cited

U.S. PATENT DOCUMENTS

| | | |
|---|---|---|
| 2010/0026865 A1 | 2/2010 | Tivarus et al. |
| 2012/0298841 A1 | 11/2012 | Yamashita et al. |
| 2013/0009263 A1 | 1/2013 | Hatano et al. |
| 2015/0090863 A1 | 4/2015 | Mansoorian et al. |
| 2016/0181325 A1 | 6/2016 | Johnson et al. |
| 2016/0225827 A1 | 8/2016 | Park et al. |
| 2018/0013961 A1 | 1/2018 | Lee et al. |
| 2018/0294305 A1 | 10/2018 | Janssens et al. |
| 2019/0109171 A1 | 4/2019 | Ito |
| 2020/0303446 A1 | 9/2020 | Moriwaki |
| 2021/0175287 A1* | 6/2021 | Lee ................... H01L 27/146 |
| 2021/0249474 A1* | 8/2021 | Togashi ............ H01L 27/14612 |
| 2021/0296382 A1 | 9/2021 | Ono |
| 2021/0313381 A1* | 10/2021 | Murata ............. H01L 27/14638 |

OTHER PUBLICATIONS

Takagi et al: "Image Sensor with Organic Photoconductive Films by Stacking Red/Green and Blue Components", IS&T International Symposium on Electronic Imaging 2016, IMSE-264.1-IMSE-264.4.

* cited by examiner

Fig. 4

IMAGE SENSOR COMPRISING STACKED PHOTO-SENSITIVE DEVICES

CROSS REFERENCE TO RELATED APPLICATION

This application claims priority to European Application No. 21151621.6, filed on Jan. 14, 2021 incorporated herein by reference in its entirety.

TECHNICAL FIELD

The present invention and concept relate to photo-sensitive devices and their methods of fabrication. In particular, the present inventive concept relates to photo-sensitive devices, preferably formed by thin-film technology. And more particularly, to stacked photo-sensitive devices comprising a fully depleted pixel structure and a floating electrical connection.

BACKGROUND

Photo-sensitive devices fabricated on a silicon substrate limit the specific detectable wavelengths and include other shortcomings inherent to the optical characteristics and dimensional requirements of silicon. Accordingly, there is a need for a more compact and more optically efficient solution for a photo-sensitive device. Particularly, there is a growing demand and strong need for thin-film, depleted photodiode technology photo-sensitive devices that are monolithically integrated on semiconductor substrates. The semiconductor substrates enable circuitry for read-out and processing of signals from the photo-sensitive devices.

Traditionally, a color image sensor consists of a color filter array (CFA) stacked on top of a pixel (i.e. read-out-circuitry) to selectively absorb each color signal. One typical example includes a Bayer colour filter array, wherein three different colour signals are combined to generate a colour image. This traditional approach, however, results in one-third loss of the light signal and three-quarters loss of resolution.

More specifically, known approaches to color signals have inferior kTC noise performance, high dark current, and low conversion gains. One example, United States Published Patent Application number US 2016/0181325 discloses a CMOS image sensor combining CMOS read-out integrated circuits (ROICs) and photodiode on active pixel (POAP) technology with quantum dot (PbS-CQD) detector material. This three-transistor pixel circuit results in an unacceptably high reset noise due to un-correlated read-out (i.e. a pixel signal is read first, then a reset scheme is applied). Moreover, the photodiode area is directly connected to a pixel circuit below the photodiode area. Thus, a defective contact region will generate high dark current. In addition, conversion gain may be low because a photodiode capacitance is added to a floating diffusion node where charge-to-voltage conversion takes place. This results in poor noise characteristics overall and poor image quality.

Other examples of three-transistor, layered photodiodes include U.S. Pat. No. 5,965,875 issued on 1999 Oct. 12 to Merrill; Published U.S. Pat. App. No. 20120298841 published on 2012 Nov. 29 by Yamashita et al.; and Published U.S. Pat. App. No. 20130009263 published on 2013 Jan. 10 by Hatano et al.: Each of these aforementioned examples similarly result in undesirable noise characteristics and loss of resolution, as discussed above.

Other examples in the art included layered organic photodiodes. Representative examples include the non-patent literature (NPL) reference titled "Image Sensor with Organic Photoconductive Films by Stacking Red/Green and Blue Components," by Takagi et al. published in 2016 in the Society for Imaging Science and Technology DOI: 10.2352/ISSN.2470-1173.2016.12.IMSE-264: However, this reference suffers similar problems previously discussed as it too presents a three-transistor layered photodiodes with unacceptable noise and resolution characteristics.

Yet another example of a stacked photodiode, with a combination of organic and silicon layers, includes U.S. Pat. No. 9,748,295 to Lee et al. issued on 2017 Aug. 29. However, this approach suffers similar limitations of results in one-third loss of the light signal and three-quarters loss of resolution.

Therefore, those skilled in the art will appreciate that remains yet a need for an improved color imager that maximized the light absorbed, improves resolution, and reduces noise.

SUMMARY

Objects of the present invention and inventive concept enable a device and method of fabricating such a device comprising a photo-sensitive, thin-film, stacked, fully depleted pixel structure with a common floating electrical connection and such a device enabled for integration with a read-out integrated circuit (ROIL).

The present invention, as defined in the appended claims, meets these objectives and overcomes limitations in the known art. Exemplary embodiments, including one or more preferred embodiments are discussed herein and further set out in the dependent claims.

The present invention contemplates a device comprising at least two stacked layer devices wherein each stacked layer structure configures to respond to a respective predefined range of visible light, near infrared light, ultraviolet light, IR light, or any desired spectrum of electro-optical wavelengths.

A first embodiment discloses an image sensor (100) comprising a second photo-sensitive device (20) arranged to vertically stack over a first photo-sensitive device (10) in electrical contact with the read-out-circuitry (1), wherein the first photo-sensitive device (10) comprises a top electrode (111) configured to control a first electrical potential, a first charge transport layer (112) arranged beneath the top electrode (111), responsive to the first electrical potential, and vertically stacked on top of an active layer (113), the active layer (113) configured to generate electrical charges in response to a first predefined range of wavelengths of light incident on the device (100), a second charge transport layer (114) arranged under the active layer (113), the second charge transport layer (114) comprising a semiconductor material comprising a first portion (114a) of the charge transport layer (114), the first portion (114a) being vertically aligned underneath the active layer (113), a second portion, i.e. a transfer region (114b), protruding laterally to extend beyond the active layer (113) and a third portion (114c), a bottom electrode (116) separated by a dielectric material (115) from the second charge transport layer (114) wherein the bottom electrode (116) is configured to provide a first electrical voltage for at least partially depleting the first portion (114a) of the corresponding second charge transport layer (114), a transfer gate electrode (117) separated by a dielectric material (115) from the second charge transport layer (114), wherein the transfer gate electrode (117) is configured to control transfer of electrical charges accumulated in the first portion (114a) via the transfer region (114b) to the third portion (114c) for read-out of light detected by the first stacked layer structure (10), and a first floating electrical connection (118) extending from the third portion (114c) of the charge transport layer (114) and protruding downward therefrom onto the read-out-circuitry (1).

The second photo-sensitive device (20) comprises a top electrode (211) configured to control a corresponding second electrical potential, a first charge transport layer (212) arranged beneath the top electrode (211), responsive to the second electrical potential, and vertically stacked on top of an active layer (213), the active layer (213) configured to generate electrical charges in response to a second predefined range of wavelengths of light incident on the device (100), a second charge transport layer (214) arranged under the active layer (213), the second charge transport layer (214) comprising a semiconductor material comprising a first portion (214a) of the charge transport layer, the first portion (214a) being vertically aligned underneath the active layer (213), a second portion (214b), i.e. a transfer region, protruding laterally to extend beyond the active layer (18b) and a third portion (214c), a bottom electrode (216) separated by a dielectric material (215) from the second charge transport layer (214), wherein the bottom electrode (216) configures to provide a second electrical voltage for at least partially depleting the first portion (214a) of the corresponding second charge transport layer (214), a transfer gate electrode (217) separated by a dielectric material (215) from the second charge transport layer (214), wherein the transfer gate electrode (217) is configured to control transfer of electrical charges accumulated in the first portion (214a) via the transfer region (214b) to the third portion (214c) for read-out of light detected by the second stacked layer structure (20), and, a second floating electrical connection (218) extending from the third portion (214bc) of the charge transport layer (121) and protruding downward therefrom onto the third portion (114c) of the first photo-sensitive device (10).

A second embodiment discloses an image sensor (100) according to the first embodiment, but further comprising: a third photo-sensitive device (30) arranged to vertically stack on the second photo-sensitive device (20), the third photo-sensitive device (30) comprising a top electrode (311) configured to control a corresponding third electrical potential, a first charge transport layer (312) arranged beneath the top electrode (311), responsive to the first electrical potential, and vertically stacked on top of an active layer (313), the active layer (313) configured to generate electrical charges in response to a third predefined range of wavelengths of light incident on the device (100), a second charge transport layer (314) arranged under the active layer (313), the second charge transport layer (314) comprising a semiconductor material comprising a first portion (314a) of the charge transport layer, the first portion (314a) being vertically aligned underneath the active layer (313), a second portion (314b), i.e. a transfer region, protruding laterally to extend beyond the active layer (313) and a third portion (314c), a bottom electrode (316) separated by a dielectric material (315) from the second charge transport layer (314), wherein the bottom electrode (316) configures to provide a second electrical voltage for at least partially depleting the first portion (314a) of the corresponding second charge transport layer (314), a transfer gate electrode (317) separated by a dielectric material (215) from the second charge transport layer (314), wherein the transfer gate electrode (317) is configured to control transfer of electrical charges accumulated in the first portion (314a) via the transfer region (314b) to the third portion (314c) for read-out of light detected by the third stacked layer structure (30), a third floating electrical connection (318) extending from the third portion (314c) of the second charge transport layer (314) and protruding downward therefrom onto the third portion (214c) of the second stacked layer structure (10).

In a third embodiment, the image sensor of the foregoing embodiments is configured to have the floating electrical connections (118, 218, 318) vertically stack and are configured to transfer an electrical signal in response to any at least one range of first, second, or third predefined wavelengths of incident light from the photosensitive device to the read-out-circuitry (1). The read-out-circuitry (1) is configured to receive a signal from any of the at least one floating electrical connections (118, 218, 318) in response to light incident on any of the at least one active layers (113, 213, 313).

The following illustrative and non-limiting detailed description and accompanying drawings set forth illustrative embodiments of the present invention to enable a better understanding of the feature and advantages of the present invention.

BRIEF DESCRIPTION OF THE DRAWINGS

In the drawings like reference numerals will be used for like elements unless stated otherwise. Some features may not be illustrated in some of the views for clarity or illustrative purposes. The drawings are not to scale, unless stated otherwise.

FIG. 4 is a table describing some suitable layer material based on electro-optic frequency response.

DETAILED DESCRIPTION

Embodiments of the present invention discussed herein are exemplary and non-limiting. Those skilled in the art will appreciate that additional features may be added, or some features may be removed without impacting the spirit of the present invention. The scope of the present invention is particularly defined by the appended claims.

One contemplated and representative first embodiment of the present invention includes a light, or more generally, an image sensor comprising three stacked layer devices wherein the first stacked layer device 10 configures to respond to blue light, a second stacked layer device 20 configures to respond to red light, and a third stacked layer device 30 configures to respond to green light. The operation of each respective layer structure (10, 20, 30) is similar, so for brevity, the operating principle is summarized in the following paragraphs and further explanation is provided in the detailed description of the invention. Accordingly, each respective stacked layer device enables a photo-sensitive device with good noise characteristics and high conversion gain.

Figure 1:
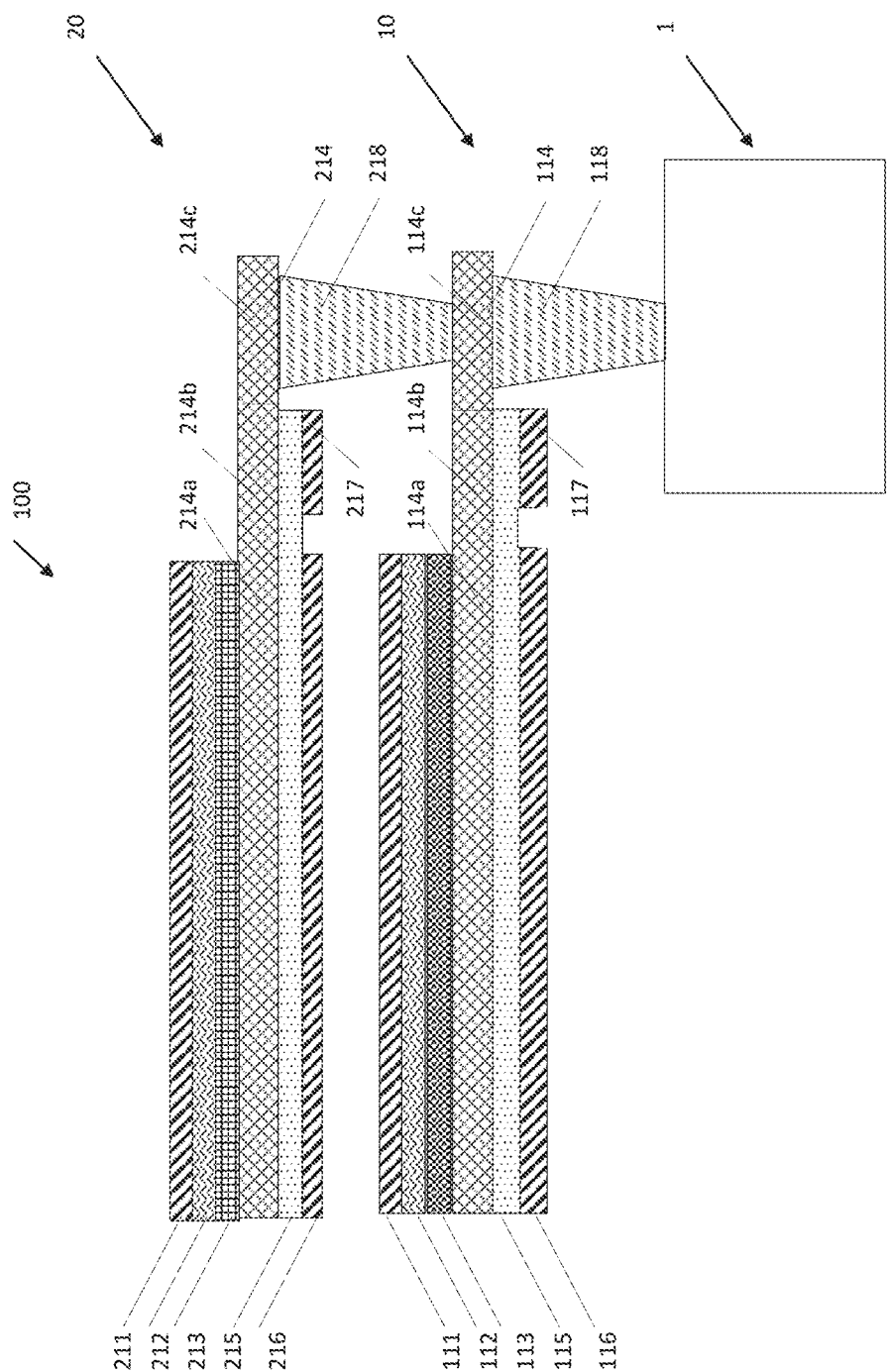
FIG. 1 is a schematic cross-sectional view of an image sensor device according to one embodiment of the present invention.

FIG. 1 illustrates a first embodiment of the present invention, an image sensor device 100 comprising a layer structure having at least two photo sensitive-devices, a first photo sensitive-device 10, and a photo sensitive-device 20.

The first photo sensitive-device 10 is a vertically arranged layer structure comprising multiple layers. Such a vertically stacked first layer structure comprises a top electrode 111 configured to control a first electrical potential. Disposed below the top electrode 111 is a first charge transport layer 112, also called a hole transport layer, which responds to the first potential. As a non-limiting example, the first potential corresponds to blue visible light range.

An active layer 113 arranges, and vertically aligns, beneath the first charge transport layer 112. The active layer 113 configures to generate charges in response to incident light on the active layer: In this exemplary embodiment—blue light. The active layer configures to absorb incident light to generate charges. Thus, an amount of charges generated is indicative of an amount of incident light on the active layer. The generated charges transport through the active layer and accumulate in the charge transport layer. In this embodiment, the active layer 113 configures to absorb light in a first pre-defined range of the electromagnetic spectrum, specifically, in the range of corresponding to blue light. The active layer arranges in a vertical stack between charge transport layers for collecting holes and electrons, respectively. Accordingly, the charge transport layer arranged below the active layer consists of either a hole transport layer or an electron transport layer.

A second charge transport layer 114 arranges, and vertically aligns, beneath the active layer 113. The second charge transport layer 114 comprises a semiconductor and includes a first portion 114a and a second portion, which is a transfer 114b that protrudes horizontally out of the vertical stack of aligned layers, thus extending beyond the active layer 113 to provide connectivity to the floating diffusion 114c. The transfer region 114b laterally displaces in a plane of the charge transport layer in relation to the first portion 114a. The transfer gate controls the movement of charges from the first portion to the second portion after accumulation. Thus, generating and accurately controlling charges in the charge transport layer. This results in good noise characteristics of the photo-sensitive device. Accordingly, once the charges accumulate in the first portion 114a, the charges may be transferred to the second portion 114b, under control of a transfer gate electrode 117, and from there to the floating diffusion 114c, ultimately enabling reading out a signal corresponding to, for example, blue light.

A bottom electrode 116 arranges, and vertically aligns, beneath a dielectric material 115, which, in turn arranges, and vertically aligns, beneath the second charge transport layer 114. Bottom electrode 116 and the second charge transport layer 114 arrange such that the first portion 114a of the second charge transport layer 114 is between bottom electrode 116 and the active layer 113 and wherein bottom electrode 116 configures to provide a first voltage, which configures to deplete the first portion 114a of the corresponding first charge transport layer 114.

A floating diffusion 114c extends downward from the second portion 114b of the second charge transport layer 114 configures to control transfer of accumulated charges from this first stacked layer structure 10 for read-out of detected light by the photo-sensitive device 100.

In this embodiment, the device 100 is describes a vertically stacked layer structure wherein the charge transport layer and the active layer arrange in separate, parallel planes, stacked vertically with respect to each other (as reference in this document based on the orientation of the associated drawings). The photo-sensitive device orients such that the charge transport layer is above the gate and, in such case, the active layer is above the charge transport layer. However, it should be realized that a layer defined as being arranged "above", "on" or "below" another layer, need not be arranged directly on top of or directly below the other layer. Rather, there may be other intermediate layers in-between.

The photo-sensitive device is configured such that it is possible to achieve full depletion of the first portion of the charge transport layer wherein charges are accumulated. It is also advantageous to configure the photo-sensitive device such that the gate will provide a voltage so that the first portion will be fully depleted. Full depletion is beneficial in providing good noise characteristics of the photo-sensitive device, since reset noise may be limited, a dark current may be limited and a high conversion gain may be provided.

Still referring to FIG. 1, the device 100 further contemplates a second stacked layer structure 20 arranged below the first structure 10. In this embodiment, the second stacked layer structure 20 configures to respond and absorb a second predefined range of visible light on the electromagnetic wave spectrum, corresponding to a light range other than of the first structure 10 for example, as would be understood commonly as red light. Some materials for portions of the second layer structure 20 may differ from those similarly corresponding stacked layers of the first layer structure 10: However, the operation principles are significantly similar and, accordingly, some features are omitted here for brevity, but will be well understood by those skilled in this art.

The second layer structure 20 comprises a top electrode 211 configured to control a corresponding second potential corresponding to absorbed light in the second predefined range of the electromagnetic spectrum and corresponding to red light.

A first charge transport layer 212 arranges beneath the top electrode 211 and vertically stacks on top of an active layer 213. The active layer 213 configures to generate charges in response to the second predefined range of wavelengths of incident light.

A second charge transport layer 214 arranges under the active layer 213. The second charge transport layer 214 comprises a semiconductor material comprising a first portion 214a that vertically aligns underneath the active layer 213. The second charge transport layer 214 further comprises a second portion, which is a transfer region 214b. This transfer region 214b protrudes laterally to extend beyond the active layer 213 and otherwise enables connectivity to a floating diffusion 214c.

A bottom electrode 216 arranged below and vertically aligns with the second charge transport layer 214. A dielectric material layer 215 arranges between the bottom electrode 216 and the charge transport layer 214. The bottom electrode 216 configures to provide a second voltage for fully depleting the first portion 214a of the corresponding second charge transport layer 214.

A second floating diffusion 214c extends from the transfer gate 217 of the second charge transport layer 214 and protruding therefrom.

Figure 2:
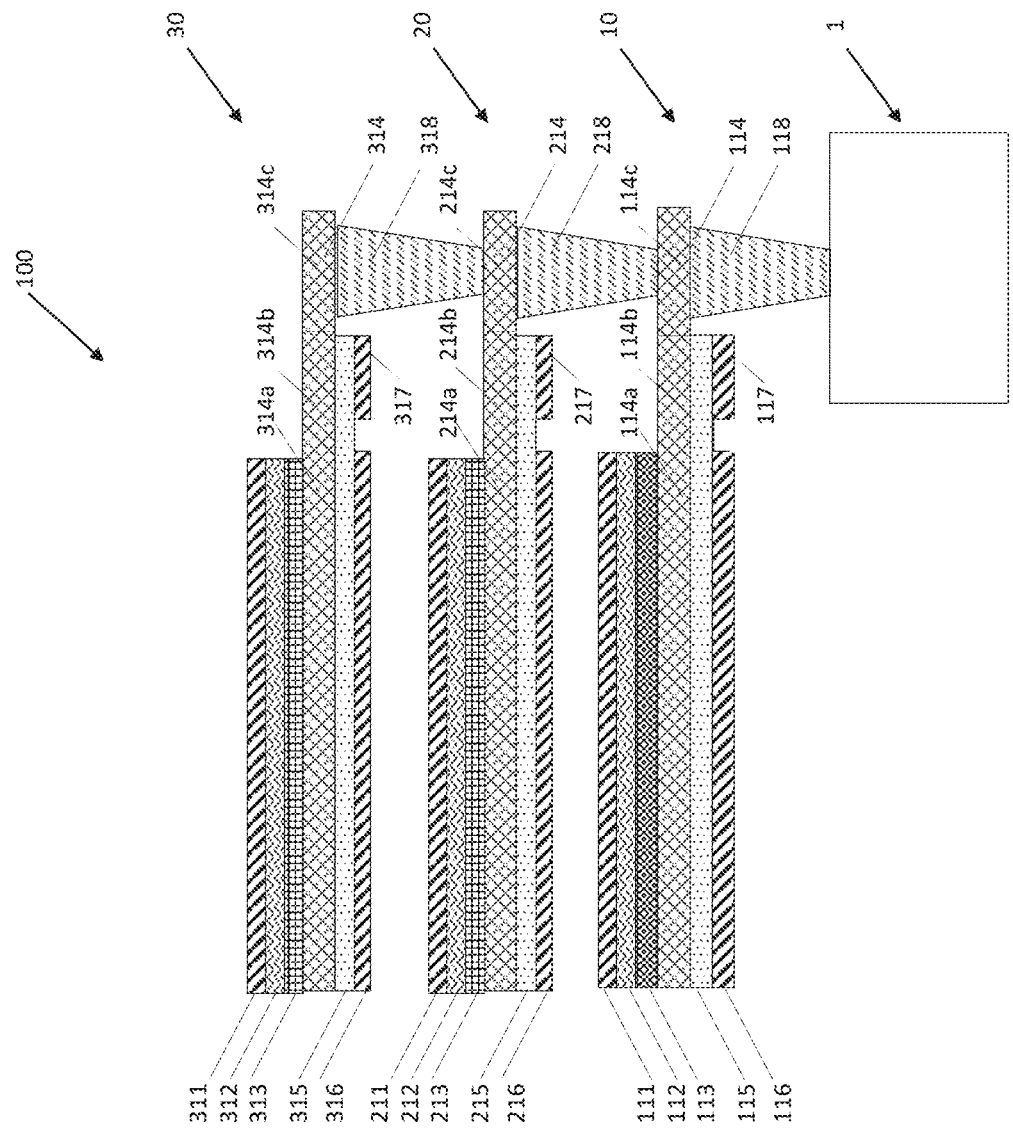
FIG. 2 is a schematic cross-sectional view of an image sensor device according to another embodiment of the present invention.

FIG. 2 illustrates a second aspect of the present invention. According to this embodiment, a photo-sensitive device 100 comprises three stacked structures (10, 20, 30) combined with a read-out circuit 250. The first layer structure 10 and the second layer structure 20 are described above in relation to the first embodiment. The third layer structure 30 is similar in construction to the first or second layer structure; however, in the third layer structure is configured to respond to a light range, other than the first 10 and the second structure 20, e.g. green light, and the materials and structure of the multiple-layered third layer structure 30 are selected to enable the third layer structure 30 to respond to a third predetermined wavelength range.

The third stacked layer structure 30 configures and arranges to vertically stack underneath the second stacked layer structure 20. The third stacked layer structure 30 comprises a corresponding a top electrode 311 configured to control a corresponding third potential. One exemplary third potential corresponds to green light in a third predefined wavelength range. The third stacked layer structure further comprises a first charge transport layer 312 arranged beneath the top electrode 311 and vertically stacked on top of an active layer 313. The active layer 313 configures to generate charges in response to the third predefined range of wavelengths of incident light. A second charge transport layer 314 arranges under the active layer 313. The second charge transport layer 314 comprises a semiconductor material having a first portion 314a that vertically aligns underneath the active layer 313 and a second portion 314b (also called a transfer region) protruding laterally to extend beyond the active layer 313. A gate 317 separated by a dielectric material 315 from the second charge transport layer 314, and a third floating diffusion 314c extending from the transfer region 314c of the charge transport layer 314 and protruding therefrom completes the third stacked layer structure 30.

Additionally, the device 200 arranges the three stacked layer structures (10, 20, 30) to vertically align their respective floating diffusions (114c, 214c, 314c) to enable the Read Out Integrated Circuit (ROIC) 1 to receive the receive the electrical signal in response of light impinging on the photo-sensitive device 100.

The photo-sensitive device 100 thus integrates with a substrate on which read-out integrated circuit 1 is provided. This ensures that the photo-sensitive device with read-out circuitry may be very compact and allows processing of detected signals in a small-scale device. The read-out integrated circuit may be used for reading out signals of detected amount of light, but may also be used for more advanced processing of the signals.

The read-out integrated circuit 1 may be formed by integrated semiconductor technology, such as using complementary metal-oxide-semiconductor (CMOS) circuitry. Thus, the photo-sensitive device may make use of existing technology for manufacturing of small-scale circuitry.

The active layer and charge transport layer may be formed on a silicon CMOS wafer, on which a read-out integrated circuit is formed. However, it should be realized that the active layer and charge transport layer may alternatively be formed on other substrates, such as a thin-film technology wafer, which may for example use organic materials.

It should be realized that the active layer and the charge transport layer may be arranged in different relations to a read-out integrated circuit. For instance, the active layer and the charge transport layer may be arranged on top of the read-out integrated circuit on the substrate. However, in another embodiment, the active layer and the charge transport layer may be arranged on a common substrate with the read-out integrated circuit, but the active layer and the charge transport layer of the photo-sensitive device may be arranged next to the read-out integrated circuit on the substrate. For instance, the active layer and the charge transport layer of the photo-sensitive device and the read-out integrated circuit may be arranged on the same polyimide substrate. In such case, the read-out integrated circuit may be designed by using thin-film technology.

Figure 3:
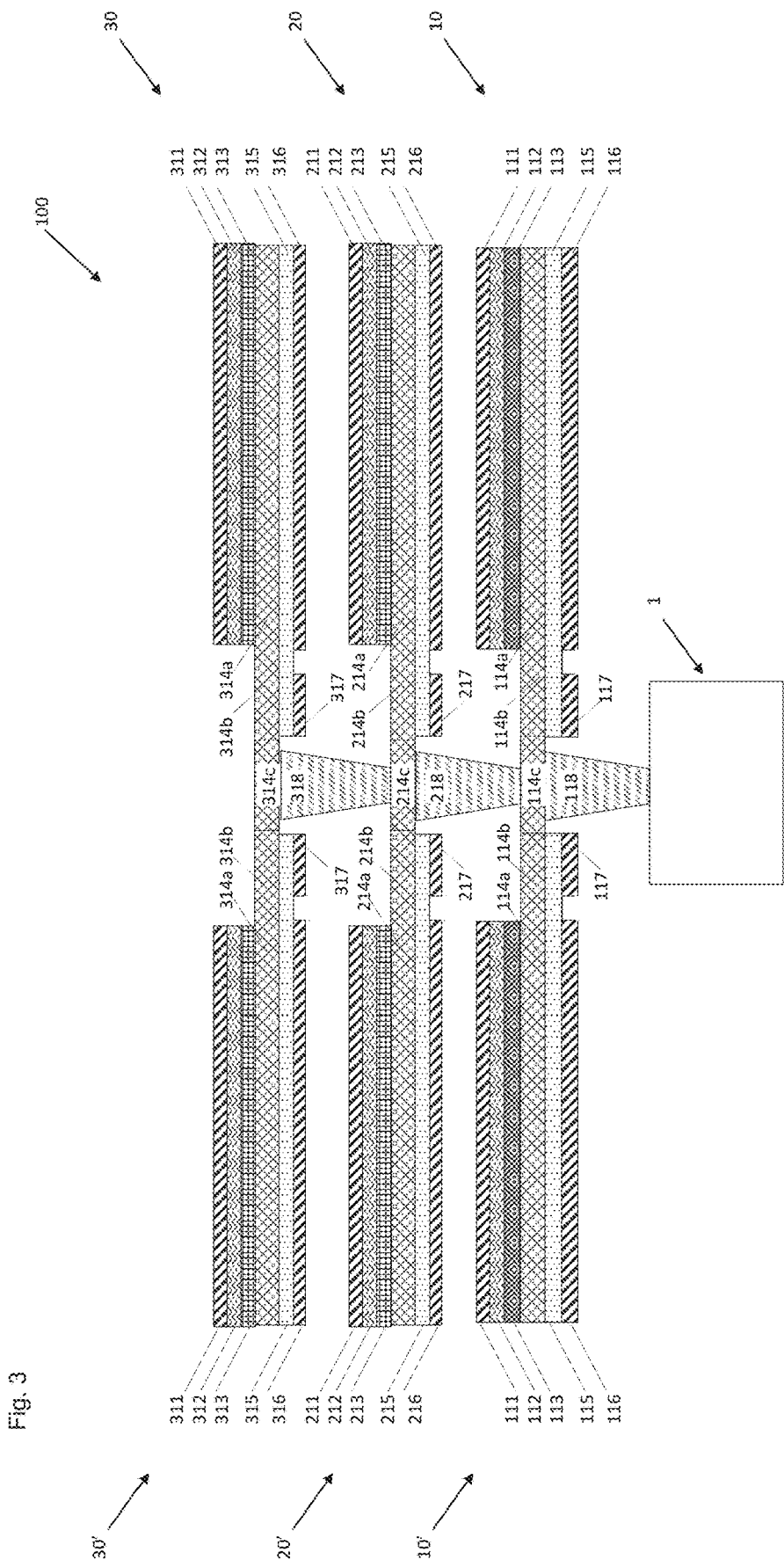
FIG. 3 is a schematic cross-sectional view of an image sensor device according to yet another embodiment of the present invention.

FIG. 3 illustrates a third contemplated aspect in another embodiment according to the present invention. A photo-sensitive device 100 comprises two sets of a triple-stacked multi-layer structure. Thus, (as illustrated in FIG. 3) the left side of the device 100 comprises a first stacked layer structure 10' adapted to respond to blue light as defined in the first predetermined range of light, a second stacked layer structure 20' adapted to respond to red light as defined in the second predetermined range of light, and a third stacked layer structure 30' adapted to respond to green light as defined in the third predetermined range of light. Further, the device 100 additionally comprises, on the right-hand side (of FIG. 3), a first stacked layer structure 10 adapted to respond to blue light as defined in the first predetermined range of light, a second stacked layer structure 20 adapted to respond to red light as defined in the second predetermined range of light, and a third stacked layer structure 30 adapted to respond to green light as defined in the third predetermined range of light. The configuration, operation, and performance of each layer structure (10, 10', 20, 20', 30, 30') is identical to the corresponding structures defined in the first and second embodiments/aspects, above.

Additionally, the device 100 includes a read-out integrated circuit 1, as previously described in relation to the second embodiment.

Figure 5:
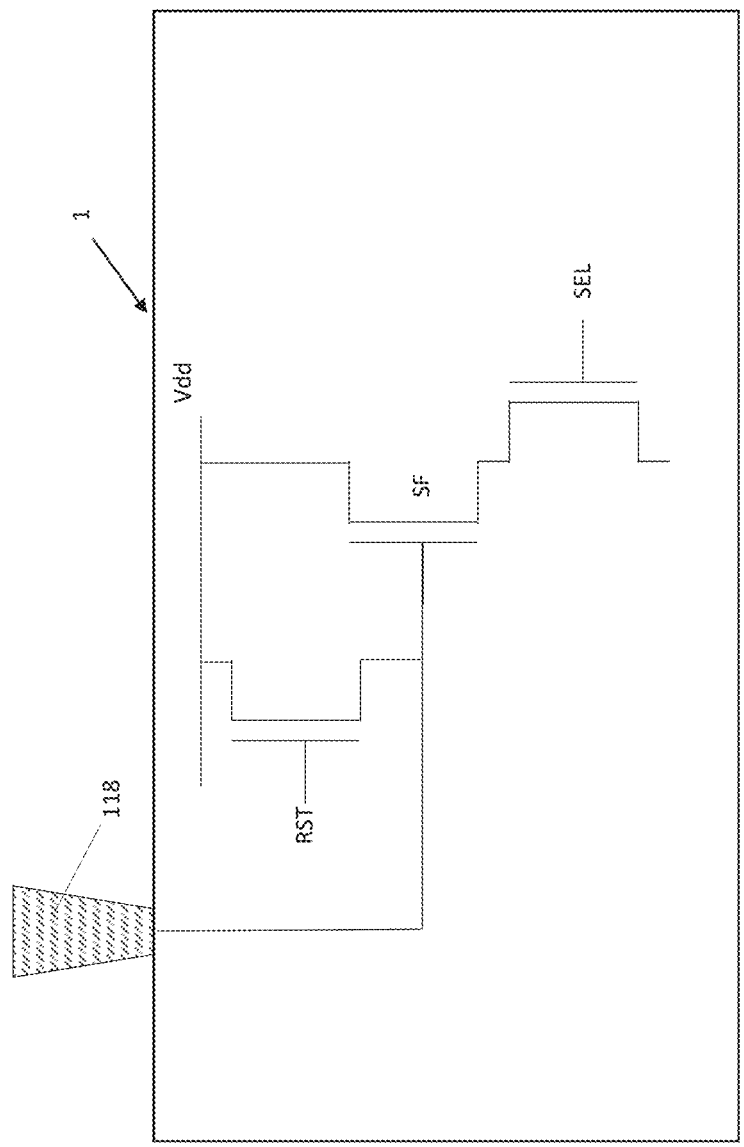
FIG. 5 is a schematic layout of read-out-circuitry suitable for use in the embodiments.

Notably, the device 300 uses a common stack of floating diffusions (314c, 214c, 114c) whereby left and right pairs of stacked devices share a single, common floating diffusion. Thus, stacked device 10 and 10' use the common floating diffusion 114c. Likewise, the pairs of stacked devices 20 and 20' a use the common floating diffusion 214c, and pairs of stacked devices 30 and 30' use the common floating diffusion 214c. Further the floating diffusions 114c, 214c, 314c align in a vertical stack to electrically couple to the ROIC 1. The read-out-circuitry 1 is configured to receive a signal from any of the at least one floating electrical connections 118, 218, 318 in response to light incident on any of the at least one active layers 113, 213, 313. FIG. 5 illustrates a read-out circuitry 1 connected to the stack of electrical connections 118, 218, 318. The FIG. 5 illustrates a state-of-the art ROIC comprising a Reset Transistor RST, a select transistor SEL and a sense transistor SF.

According to an embodiment, the active layer comprises a quantum dot, an organic photodetector material or a perovskite material. These materials allow detection of light in different wavelength intervals or predetermined ranges. Thus, the photo-sensitive device may for instance be used for detecting infrared light, which may not be possible if silicon is used for light detection. Use of quantum dot, organic photodetector material and perovskite materials may be well suited to the configuration of the photo-sensitive device. However, it should be realized that it may also be possible to use other materials.

According to an embodiment, wherein the active layer and charge transport layer are formed using thin-film layer deposition. Thin-film layer deposition may be suitable for monolithic integration of structures using vast amount of materials, e.g. organic materials. This may be advantageously used in the photo-sensitive device, which may be suited for use of e.g. organic materials in light detection.

According to an embodiment, the charge transport layer is an electron transport layer and the photo-sensitive device further comprises a hole transport layer arranged such that the active layer is between the hole transport layer and the electron transport layer. It may be particularly suitable to use an electron transport layer as the charge transport layer. Suitable materials may be readily available.

According to an embodiment, the photo-sensitive device further comprises a top electrode layer arranged above the hole transport layer, wherein the top electrode layer is configured to control a potential of the hole transport layer. Thus, the active layer and the charge transport layers are arranged between two electrodes controlling potential of the layers to control function of the photo-sensitive device.

The top electrode layer may be configured to be transparent to relevant wavelengths (to be detected by the photo-sensitive device) to ensure that the light is passed to the active layer for detection with high sensitivity.

According to another embodiment, the charge transport layer is a hole transport layer and wherein the photo-sensitive device further comprises an electron transport layer arranged such that the active layer is between the electron transport layer and the hole transport layer. Thus, it should be realized that the photo-sensitive device need not necessarily be formed using an electron transport layer as the charge transport layer for detecting the amount of light incident on the photo-sensitive device, but rather a hole transport layer may alternatively be used.

According to an embodiment, the charge transport layer is formed by a metal-oxide semiconductor. This may ensure that the charge transport layer may be formed by a suitable material. Various alternatives exist, such as indium-gallium-zinc oxide (IGZO), indium-tin-zinc-oxide or hafnium-indium-zinc-oxide using an n-type semiconductor. Other alternatives are tin-oxide, copper-oxide, selenides and sulfides using a p-type semiconductor.

Figure 4:
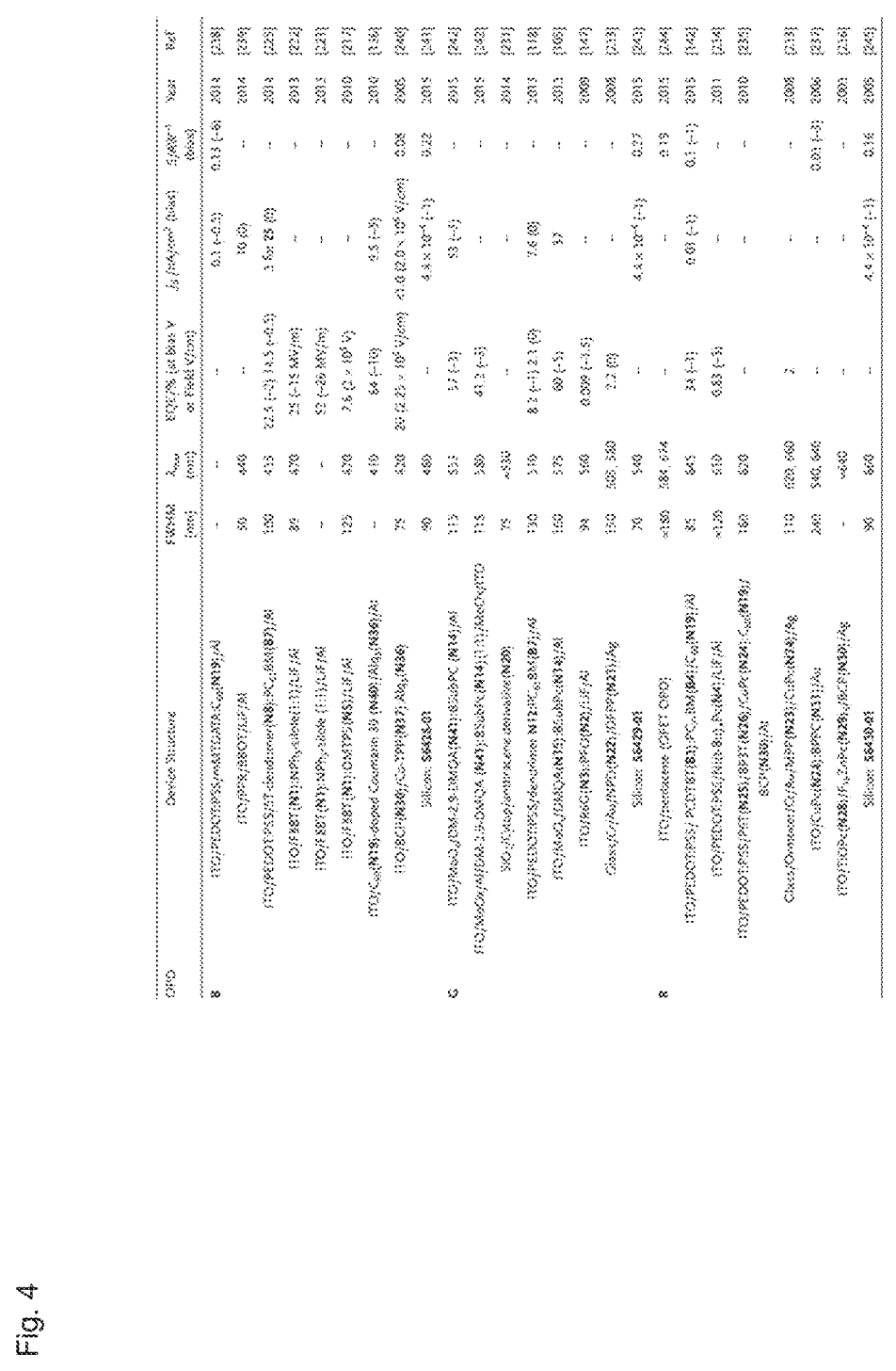

FIG. 4 lists suitable layer material based on their electro-optic frequency response.

According to an embodiment, the gate and the transfer gate are arranged on different sides of the charge transport layer or the gate and the transfer gate are arranged on a same side of the charge transport layer or the transfer gate comprises a first portion and a second portion, wherein the first portion of the transfer gate and the second portion of the transfer gate are arranged on opposite sides of the charge transport layer. Thus, the transfer gate may be arranged in different configurations in relation to the charge transport layer. The transfer gate may be arranged to provide a well-controlled transfer of charges from the first portion to the second portion of the charge transport layer.

According to a second aspect, there is provided an image sensor comprising an array of photo-sensitive devices 100 according to the first aspect. Effects and features of this second aspect are largely analogous to those described above in connection with the first aspect. Embodiments mentioned in relation to the first aspect are largely compatible with the second aspect. Thus, the photo-sensitive devices may be used for forming in imaging sensor to enable imaging. For instance, this may be very useful for infrared imaging.

In an image sensor, components of the photo-sensitive devices 100 may be shared. This implies that a number of transistors may be used efficiently in the array in relation to the number of photo-sensitive devices. For instance, a read-out integrated circuit 1 associated with the array of photo-sensitive devices 100 may be arranged such that one or more transistors of the read-out integrated circuit are shared per photo-sensitive device.

According to an embodiment, at least a second portion of a first photo-sensitive device 100 in the array and a second portion of a second photo-sensitive device 100 in the array are shared in the charge transport layer. This implies that a floating diffusion node of the first and the second photo-sensitive device may be shared. Hence, a number of transistors per photo-sensitive device may be reduced, which may ensure that size of each photo-sensitive device may be reduced for enabling high resolution imaging.

By setting a level of the gate voltage properly, the gate voltage provided to the electrode arranged below the first portion of the charge transport layer need not be varied. Rather, a constant gate voltage may be provided, for example a DC signal may be provided to the gate. This implies that control of the gate is very simple and need not be accurately timed.

However, according to another embodiment, a high gate voltage is provided to the electrode for biasing the photo-sensitive device to accumulate charges in the first portion of the charge transport layer and a low gate voltage is provided when transferring charges.

The low gate voltage is defined as "low" in that it is lower than the high gate voltage.

The low gate voltage may bias the photo-sensitive device such that the charge transport layer in the first portion is fully depleted when charges have been transferred from the first portion to the second portion.

In the above description the inventive concept has mainly been described with reference to a limited number of examples. However, as is readily appreciated by a person skilled in the art, other examples than the ones disclosed above are equally possible within the scope of the inventive concept, as defined by the appended claims.

For ease of reference, and as illustrated in the drawings, embodiments of the present invention are described from a cross-sectional viewpoint and includes the arbitrary designation of top and bottom. Herein, "top" refers to the orientation of a surface of an image sensor that receives incoming light.

Various alternatives to the embodiments of the invention described herein may be employed in practicing the invention, and although the following claims define the scope of the invention, the methods, structures, and their equivalents, are covered by the claims.

The invention claimed is:
1. An image sensor comprising:
a second photo-sensitive device arranged to vertically stack over a first photo-sensitive device in electrical contact with the read-out-circuitry, wherein
the first photo-sensitive device comprises
a top electrode configured to control a first electrical potential,
a first charge transport layer arranged beneath the top electrode, responsive to the first electrical potential, and vertically stacked on top of an active layer,
the active layer configured to generate electrical charges in response to a first predefined range of wavelengths of light incident on the device,
a second charge transport layer arranged under the active layer, the second charge transport layer comprising a semiconductor material comprising a first portion of the charge transport layer, the first portion being vertically aligned underneath the active layer, a second portion, i.e. a transfer region, protruding laterally to extend beyond the active layer, and a third portion,
a bottom electrode separated by a dielectric material from the second charge transport layer wherein the bottom electrode is configured to provide a first electrical voltage for at least partially depleting the first portion of the corresponding second charge transport layer, a transfer gate electrode separated by a dielectric material from the second charge transport layer, wherein the transfer gate electrode is configured to control transfer of electrical charges accumulated in the first portion via the transfer region to the third portion for read-out of light detected by the first stacked layer structure, and a first floating electrical connection extending from the third portion of the charge transport layer and protruding downward therefrom onto the read-out-circuitry; and the second photo-sensitive device comprises a top electrode configured to control a corresponding second electrical potential, a first charge transport layer arranged beneath the top electrode, responsive to the second electrical potential, and vertically stacked on top of an active layer, the active layer configured to generate electrical charges in response to a second predefined range of wavelengths of light incident on the device, a second charge transport layer arranged under the active layer, the second charge transport layer comprising a semiconductor material comprising a first portion of the charge transport layer, the first portion being vertically aligned underneath the active layer, a second portion, i.e. a transfer region, protruding laterally to extend beyond the active layer and a third portion, a bottom electrode separated by a dielectric material from the second charge transport layer, wherein the bottom electrode configures to provide a second electrical voltage for at least partially depleting the first portion of the corresponding second charge transport layer, a transfer gate electrode separated by a dielectric material from the second charge transport layer, wherein the transfer gate electrode is configured to control transfer of electrical charges accumulated in the first portion via the transfer region to the third portion for read-out of light detected by the second stacked layer structure, and, a second floating electrical connection extending from the third portion of the charge transport layer and protruding downward therefrom onto the third portion of the first photo-sensitive device.

2. The image sensor of claim 1 further comprising:

a third photo-sensitive device arranged to vertically stack on the second photo-sensitive device, the third photo-sensitive device comprising a top electrode configured to control a corresponding third electrical potential, a first charge transport layer arranged beneath the top electrode, responsive to the first electrical potential, and vertically stacked on top of an active layer, the active layer configured to generate electrical charges in response to a third predefined range of wavelengths of light incident on the device, a second charge transport layer arranged under the active layer, the second charge transport layer comprising a semiconductor material comprising a first portion of the charge transport layer, the first portion being vertically aligned underneath the active layer, a second portion, i.e. a transfer region, protruding laterally to extend beyond the active layer and a third portion, a bottom electrode separated by a dielectric material from the second charge transport layer, wherein the bottom electrode configures to provide a second electrical voltage for at least partially depleting the first portion of the corresponding second charge transport layer, a transfer gate electrode separated by a dielectric material from the second charge transport layer, wherein the transfer gate electrode is configured to control transfer of electrical charges accumulated in the first portion via the transfer region to the third portion for read-out of light detected by the third stacked layer structure, a third floating electrical connection extending from the third portion of the second charge transport layer and protruding downward therefrom onto the third portion of the second stacked layer structure.

3. The image sensor of claim 1 wherein:

the floating electrical connections vertically stack and are configured to transfer an electrical signal in response to any at least one range of first, second, or third predefined wavelengths of incident light from the photo-sensitive device to the read-out-circuitry.

4. The photo-sensitive device of claim 3 wherein:

the read-out-circuitry is configured to receive a signal from the stack of floating electrical connections in response to light incident on any of the at least one active layers.

5. The image sensor of claim 2 wherein:

the floating electrical connections vertically stack and are configured to transfer an electrical signal in response to any at least one range of first, second, or third predefined wavelengths of incident light from the photo-sensitive device to the read-out-circuitry.

6. The photo-sensitive device of claim 5 wherein:

the read-out-circuitry is configured to receive a signal from the stack of floating electrical connections in response to light incident on any of the at least one active layers.

* * * * *